United States Patent
Yamamoto et al.

(10) Patent No.: US 12,074,053 B2
(45) Date of Patent: Aug. 27, 2024

(54) CHUCK TABLE AND METHOD OF MANUFACTURING CHUCK TABLE

(71) Applicant: DISCO CORPORATION, Tokyo (JP)

(72) Inventors: Setsuo Yamamoto, Tokyo (JP); Nobuyuki Goto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 349 days.

(21) Appl. No.: 17/010,397

(22) Filed: Sep. 2, 2020

(65) Prior Publication Data

US 2021/0074575 A1 Mar. 11, 2021

(30) Foreign Application Priority Data

Sep. 9, 2019 (JP) .................................. 2019-163638

(51) Int. Cl.
*H01L 21/683* (2006.01)
*B23K 26/08* (2014.01)
(Continued)

(52) U.S. Cl.
CPC ...... *H01L 21/6838* (2013.01); *B23K 26/0853* (2013.01); *B25B 11/005* (2013.01);
(Continued)

(58) Field of Classification Search
CPC .......... B23Q 3/088; B23Q 1/25; B23Q 1/623; H01L 21/6838; H01L 21/68; B23K 26/0853; B25B 11/005
See application file for complete search history.

(56) References Cited

U.S. PATENT DOCUMENTS 4,906,011 A * 3/1990 Hiyamizu ............. B25B 11/005
269/21
6,570,374 B1 5/2003 Moldavsky et al.
(Continued)

FOREIGN PATENT DOCUMENTS

DE 102017215424 A1 3/2018
JP 11254259 A 9/1999
(Continued)

OTHER PUBLICATIONS

Ipolymer, Vacuum Chucking—How and Why?, Sep. 3, 2014; https://www.ipolymer.com/blog/vacuum-chucking-how-and-why/#:~:text=In%20a%20vacuum%20chuck%2C%20air,the%20atmospheric%20pressure%20is%20lower (Year: 2014).*
(Continued)

*Primary Examiner* — Abbie E Quann
(74) *Attorney, Agent, or Firm* — Greer, Burns & Crain, Ltd.

(57) ABSTRACT

A processing apparatus includes a chuck table for holding a plate-shaped workpiece under suction on a holding surface thereof, a processing unit for processing the workpiece held on the holding surface of the chuck table, and a moving unit for moving a support base supporting the chuck table thereon in a processing-feed direction. The chuck table is formed from a porous material having pores, and has the holding surface and a mountable assembly positioned opposite the holding surface and mountable on an upper surface of the support base. Fluid passages defined in the chuck table for allowing a negative pressure transmitted from the support base to act on the holding surface are provided only by the pores in the porous material.

7 Claims, 11 Drawing Sheets

(51) Int. Cl.
  *B25B 11/00* (2006.01)
  *H01L 21/67* (2006.01)
  *B23K 26/00* (2014.01)
  *B23K 103/00* (2006.01)
  *C03B 19/06* (2006.01)
  *H01L 21/68* (2006.01)

(52) U.S. Cl.
  CPC .... *H01L 21/67115* (2013.01); *B23K 26/0006* (2013.01); *B23K 2103/56* (2018.08); *C03B 19/06* (2013.01); *H01L 21/68* (2013.01)

(56) References Cited

U.S. PATENT DOCUMENTS

| | | | | |
|---|---|---|---|---|
| 2005/0152088 | A1* | 7/2005 | Ito | G03F 7/707 |
| | | | | 361/233 |
| 2010/0194012 | A1* | 8/2010 | Tatsumi | H01L 21/6838 |
| | | | | 269/21 |
| 2015/0162231 | A1* | 6/2015 | Cox | H01L 21/6838 |
| | | | | 29/559 |
| 2018/0065187 | A1* | 3/2018 | Yamamoto | H01L 21/6838 |
| 2018/0374739 | A1* | 12/2018 | Onodera | H01L 21/6875 |
| 2019/0001433 | A1 | 1/2019 | Yamamoto | |
| 2019/0084778 | A1* | 3/2019 | Takata | H01L 21/67346 |

FOREIGN PATENT DOCUMENTS

| | | |
|---|---|---|
| JP | 2004502139 A | 1/2004 |
| JP | 2011009423 A | 1/2011 |
| JP | 2011258846 A | 12/2011 |
| JP | 2018041799 A | 3/2018 |
| JP | 2018098363 A | 6/2018 |
| JP | 2019009418 A | 1/2019 |
| JP | 2019012795 A | 1/2019 |
| KR | 20190001525 A | 1/2019 |
| WO | 0200394 A1 | 1/2002 |
| WO | 2017154085 A1 | 9/2017 |

OTHER PUBLICATIONS

EP search report issued in counterpart European patent application No. EP 20195029.2-1016, dated Feb. 19, 2021.
Japanese translated Office Action for corresponding Japanese Patent Application No. JP 2019-163638 dated May 23, 2023 (4 pages).

* cited by examiner

FIG.1
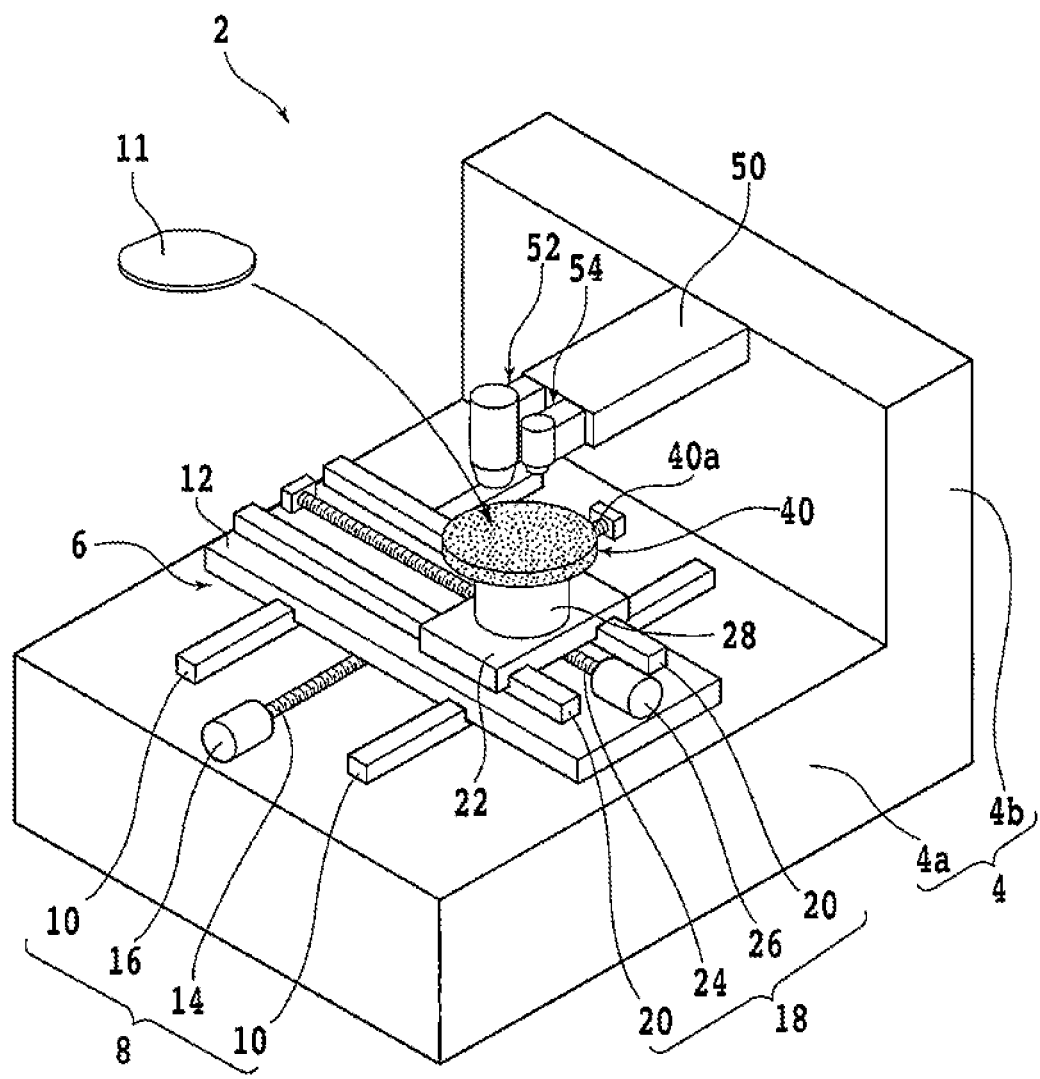
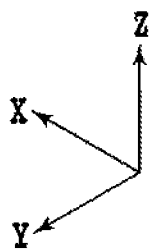

S10

S10

S20

S30

S40

CHUCK TABLE AND METHOD OF MANUFACTURING CHUCK TABLE

BACKGROUND OF THE INVENTION

Field of the Invention

The present invention relates to a chuck table for use in a processing apparatus and a method of manufacturing such a chuck table.

Description of the Related Art

Processing apparatuses for processing plate-shaped workpieces employ a chuck table for holding a workpiece under suction (see, for example, JP2018-98363A). The chuck table normally has a frame generally shaped as a disk made of a metal material such as stainless steel. The frame has a recess defined as a disk-shaped space in an upper surface thereof. A disk-shaped porous plate formed from a porous material such as porous ceramic is fixed in the recess by an adhesive or the like. A plurality of annular suction passages are defined concentrically in a bottom surface of the recess in the frame. The annular suction passages are held in fluid communication with each other through straight grooves defined in the bottom surface of the recess.

The frame has a cylindrical boss disposed on a lower surface thereof. The cylindrical boss has a hollow cylindrical suction channel defined therein that extends through the cylindrical boss and is held in fluid communication with the annular suction passages. A movable base, i.e., a support base, is disposed beneath the frame. The support base has a cylindrical recess defined in an upper surface thereof. The cylindrical boss of the frame is fitted in the cylindrical recess in the support base. The support base has a suction hole defined in a bottom surface of the cylindrical recess. The suction hole has an upper portion held in fluid communication with the suction channel that extends through the cylindrical boss of the frame and a lower portion held in fluid communication with a suction source such as an ejector. When the suction source is actuated, it generates a negative pressure that is transmitted through the suction hole and the annular suction passages and acts on an upper surface of the porous plate. Therefore, the upper surface of the porous plate functions as a holding surface for holding the workpiece under suction thereon.

Normally, the upper surface of the porous plate and an annular upper surface of the frame that is positioned around an outer circumferential portion of the porous plate are machined so as to lie flush with each other by a polishing apparatus or the like. However, there are instances where it is difficult to select proper polishing stones and proper polishing conditions for polishing the porous plate and the frame to make their upper surfaces lie flush with each other. In a case in which proper polishing conditions are not selected, residual stresses may be produced in the porous plate, tending to dislodge the porous plate from the frame, and the upper surface of the porous plate may be deformed into a protruding shape. In a case in which a relatively large chuck table is fabricated in order to hold a large-diameter workpiece such as a wafer, the chuck table increases in weight because the frame as well as the porous plate needs to be large in size. In a case in which the chuck table is to be moved at a high speed by a moving unit, since the moving unit needs to produce stronger drive forces for moving the chuck table, the moving unit needs to be larger in size, resulting in an increase in the cost thereof.

There has been known a chuck table that is free of a frame and has only a porous plate (see, for example, JP Hei-11-254259A). However, it is necessary to form fluid passages corresponding to the annular suction passages and the hollow cylindrical suction channel in the porous plate (see, for example, JP2011-9423A).

SUMMARY OF THE INVENTION

The present invention has been made in view of the above problems. It is an object of the present invention to provide a chuck table that is free of a frame and has a porous plate, the porous plate being free of fluid passages corresponding to annular suction passages and a hollow cylindrical suction channel therein.

In accordance with an aspect of the present invention, there is provided a chuck table for use in a processing apparatus including a chuck table for holding a plate-shaped workpiece under suction on a holding surface thereof, a processing unit for processing the workpiece held on the holding surface of the chuck table, and a moving unit for moving a support base supporting the chuck table thereon in a processing-feed direction. The chuck table is formed from a porous material having pores. The chuck table has the holding surface and a mountable assembly positioned opposite the holding surface and mountable on an upper surface of the support base. Fluid passages defined in the chuck table for allowing a negative pressure transmitted from the support base to act on the holding surface are provided only by the pores in the porous material.

Preferably, when a suction source held in fluid communication with the chuck table is in operation, a magnitude of a gage pressure developed on the mountable assembly when the workpiece is not held on the holding surface ranges from 60% to 80% of a magnitude of a gage pressure developed on the mountable assembly when the workpiece is held on the holding surface.

Preferably, the chuck table has an outer circumferential side surface interconnecting the holding surface and the mountable assembly, the outer circumferential side surface being covered with a sealant.

Preferably, the chuck table has a first region positioned on a holding surface side thereof and a second region positioned on a mountable assembly side thereof and having pores larger than pores in the first region.

Preferably, the chuck table includes an electrically conductive material, the electrically conductive material forming an electrically conductive path from the holding surface to the mountable assembly.

Preferably, the porous material includes porous ceramic or porous glass.

Preferably, the porous material includes porous glass, and the processing unit includes a laser beam applying unit.

In accordance with another aspect of the present invention, there is provided a method of manufacturing a chuck table formed from a porous material, for use in a processing apparatus including a chuck table for holding a plate-shaped workpiece under suction on a holding surface thereof, a processing unit for processing the workpiece held on the holding surface of the chuck table, and a moving unit for moving a support base supporting the chuck table thereon in a processing-feed direction. The method includes a molding step of molding particulate or powdery glass into a compact and a sintering step of sintering, after the molding step, the compact into a sintered body such that interstices in the particulate or powdery glass are left as pores in the sintered body. After the sintering step, fluid passages defined in the chuck table for allowing a negative pressure transmitted from the support base to act on the holding surface are provided only by the pores in the sintered body.

The chuck table according to the aspects of the present invention is formed from the porous material having pores. Since the chuck table is free of a frame of metal, but is formed from a porous material only, the chuck table is much lighter than conventional chuck tables having frames. Consequently, even if the chuck table increases in size, the load imposed on the moving unit by the chuck table is low. Furthermore, it is easier to polish the porous plate than to polish a frame and a porous plate. In addition, the fluid passages defined in the chuck table for allowing a negative pressure transmitted from the support base to act on the holding surface are provided only by the pores in the porous material. Consequently, it is not necessary to form annular suction passages and a hollow cylindrical suction channel in the chuck table.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 1 is a perspective view of a laser processing apparatus incorporating a chuck table according to a first embodiment of the present invention;

DETAILED DESCRIPTION OF THE PREFERRED EMBODIMENTS

Figure 2A:
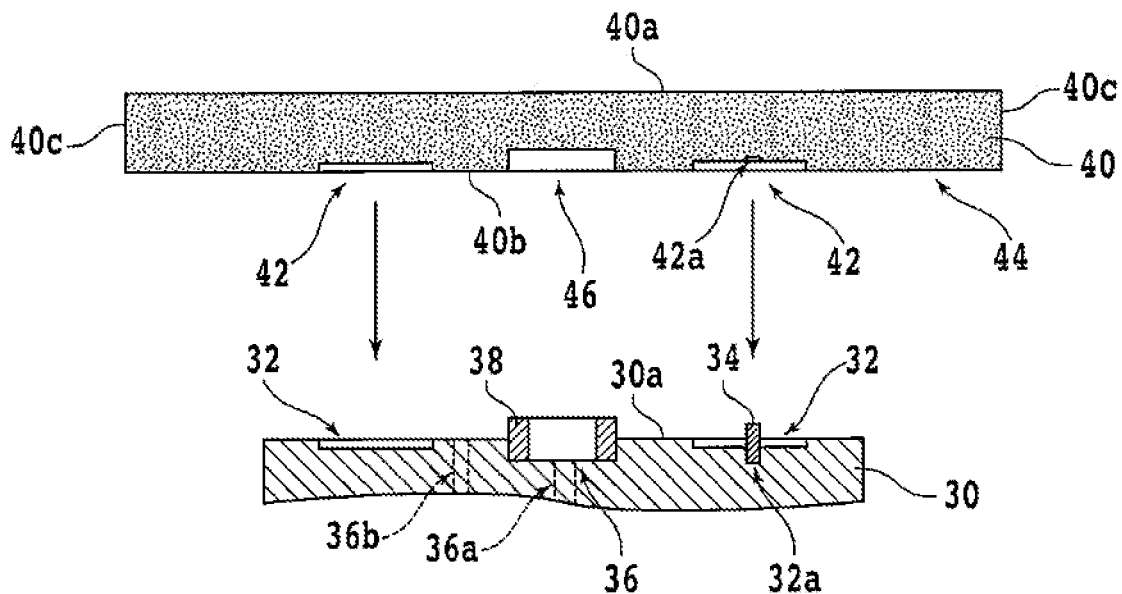
FIG. 2A is a side elevational view, partly in cross section, of a support base and a porous plate.

Preferred embodiments of the present invention will hereinafter be described below with reference to the accompanying drawings. FIG. 1 illustrates in perspective a laser processing apparatus 2 incorporating a chuck table according to a first embodiment of the present invention. The laser processing apparatus 2, i.e., a processing apparatus, includes a base table 4 that supports various structural components of the laser processing apparatus 2. The base table 4 includes a base 4a in the form of a rectangular parallelepiped and a wall 4b extending upwardly from a rear end of the base 4a. A moving assembly 6 is mounted on an upper surface of the base 4a. The moving assembly 6 includes a Y-axis moving unit 8. The Y-axis moving unit 8 includes a pair of Y-axis guide rails 10 fixed to the upper surface of the base 4a and extending parallel to Y-axis directions, i.e., indexing feed directions.

The Y-axis moving unit 8 includes a Y-axis movable table 12 slidably mounted on the Y-axis guide rails 10. The Y-axis movable table 12 has a nut, not illustrated, mounted on a reverse side, i.e., a lower surface, thereof and operatively threaded over a Y-axis ball screw 14 disposed between and extending parallel to the Y-axis guide rails 10. The Y-axis ball screw 14 has an end coupled to a Y-axis stepping motor 16. When the Y-axis stepping motor 16 is energized, it rotates the Y-axis ball screw 14 about its own central axis, causing the Y-axis movable table 12 to move in one of the Y-axis directions along the Y-axis guide rails 10.

The moving assembly 6 also includes an X-axis moving unit 18 mounted on a face side, i.e., an upper surface, of the Y-axis movable table 12. The X-axis moving unit 18 includes a pair of X-axis guide rails 20 fixed to an upper surface of the Y-axis movable table 12 and extending parallel to X-axis directions, i.e., processing feed directions. The X-axis moving unit 18 includes an X-axis movable table 22 slidably mounted on the X-axis guide rails 20. The X-axis movable table 22 has a nut, not illustrated, mounted on a reverse side, i.e., a lower surface, thereof and operatively threaded over an X-axis ball screw 24 disposed between and extending parallel to the X-axis guide rails 20.

The X-axis ball screw 24 has an end coupled to an X-axis stepping motor 26. When the X-axis stepping motor 26 is energized, it rotates the X-axis ball screw 24 about its own central axis, causing the X-axis movable table 22 to move in one of the X-axis directions along the X-axis guide rails 20. A support post 28 is rotatably mounted on a face side, i.e., an upper surface, of the X-axis movable table 22. A rotary actuator, not illustrated, is coupled to the support post 28. The support post 28 is rotatable about its own central axis, i.e., a vertical Z-axis, by the rotary actuator.

A support base 30 (see FIGS. 2A and 2B) is fixedly mounted on an upper end of the support post 28. A porous plate, i.e., a chuck table, 40 in the shape of a disk larger in diameter than the support base 30 is mounted on an upper surface of the support base 30. Structural details of the support base 30 and the porous plate 40 will be described below with reference to FIG. 2A. FIG. 2A illustrates in side elevation, partly in cross section, the support base 30 and the porous plate 40. The support base 30 is made of stainless steel or the like and is of a cylindrical shape having a diameter of 200 mm, for example.

The support base 30 has an annular recess 32 defined in an upper surface 30a thereof and extending around the center of the upper surface 30a, the annular recess 32 being downwardly recessed from the upper surface 30a. One or more pin dents 32a are defined in a bottom surface of the annular recess 32 as columnar spaces that are downwardly recessed from the bottom surface of the annular recess 32. One or more positioning pins 34 that are made of metal, for example, are disposed in the one or more respective pin dents 32a. The support base 30 also has a central recess 36 defined substantially centrally in the upper surface 30a radially inwardly of the annular recess 32 as a cylindrical space that is downwardly recessed from the upper surface 30a. A hollow cylindrical seal ring 38 made of resin is disposed as a fitting member in the central recess 36.

A length, i.e., height, of the hollow cylindrical seal ring 38 is larger than a depth of the central recess 36. Therefore, the seal ring 38 that is placed in the central recess 36 protrudes upwardly beyond the upper surface 30a of the support base 30. The support base 30 has a through hole 36a defined vertically therein that is open at a bottom surface of the central recess 36. The through hole 36a is held in fluid communication with a cylindrical space defined in the seal ring 38. The through hole 36a is also held in fluid communication with a suction source C such as an ejector through a first solenoid-operated valve A (see FIG. 2B). The support base 30 also has a through hole 36b defined vertically therein between the central recess 36 and the annular recess 32. The through hole 36b has an upper end exposed on the upper surface 30a of the support base 30. The through hole 36b is held in fluid communication with the suction source C through a second solenoid-operated valve B (see FIG. 2B).

The porous plate 40 is formed from a porous material having pores. As described in detail later, the porous plate 40 is formed through a step of sintering particles of glass, a powder of glass, an aggregate of alumina, or the like, for example. The porous plate 40 is substantially of a disk shape, and includes a circular upper surface 40a, i.e., holding surface, a circular lower surface 40b positioned opposite the upper surface 40a, and an outer circumferential side surface 40c interconnecting outer circumferential edges of the upper surface 40a and the lower surface 40b.

The porous plate 40 has an annular recess 42 defined in the lower surface 40b and extending around the center of the lower surface 40b, the annular recess 42 being upwardly recessed toward the upper surface 40a. The annular recess 42 has substantially the same inside and outside diameters as the annular recess 32 in the support base 30. One or more pin dents 42a are defined in a bottom surface of the annular recess 42 as columnar spaces that are upwardly recessed from the bottom surface of the annular recess 42 toward the upper surface 40a of the porous plate 40. The one or more pin dents 42a are positioned so as to be aligned with the one or more respective pin dents 32a in the support base 30. The pin dents 42a and 32a and the positioning pin or pins 34 are of dimensions designed such that a sum of a distance from a bottom of the pin dent or dents 42a to the lower surface 40b and a distance from a bottom of the pin dent or dents 32a to the upper surface 30a is equal to a length, i.e., height, of the positioning pin or pins 34.

The porous plate 40 also has a central recess 46 defined substantially centrally in the lower surface 40b radially inwardly of the annular recess 42 as a cylindrical space that is upwardly recessed toward the upper surface 40a. The central recess 46 has substantially the same diameter as the central recess 36 in the support base 30. The central recesses 46 and 36 and the seal ring 38 are of dimensions designed such that a sum of a distance from a bottom of the central recess 46 to the lower surface 40b and a distance from a bottom of the central recess 36 to the upper surface 30a is equal to a length, i.e., height, of the seal ring 38.

The positioning pin or pins 34 and the seal ring 38 according to the present embodiment are components that are separate from the support base 30. However, the positioning pin or pins 34 and the seal ring 38 may be fixed to and integral with the support base 30. When the positioning pin or pins 34 are fitted into the pin dent or dents 42a in the porous plate 40 and the seal ring 38 is fitted into the central recess 46 in the porous plate 40, the porous plate 40 is mounted and supported on the support base 30 with the lower surface 40b of the porous plate 40 being held in contact with the upper surface 30a of the support base 30. The central recess 46, the pin dent or dents 42a, the annular recess 42, and the lower surface 40b thus make up a mountable assembly 44 that is mounted on the upper surface 30a of the support base 30. Particularly, the central recess 46 and the pin dent or dents 42a function as a fittable assembly that is fitted over the positioning pin or pins 34 and the seal ring 38 as a fitting member.

With the porous plate 40 mounted on the support base 30, the suction source C is actuated and the second solenoid-operated valve B is opened, transmitting the negative pressure from the suction source C through the through hole 36b in the support base 30 and allowing the negative pressure to act on the lower surface 40b of the porous plate 40. The porous plate 40 is now attracted under suction to the upper surface 30a of the support base 30. Since the porous plate 40, i.e., chuck table, according to the present embodiment is free of a frame of metal, but is formed from a porous material only, the chuck table is much lighter than conventional chuck tables having frames.

While the porous plate 40 is being attracted under suction to the upper surface 30a of the support base 30, the first solenoid-operated valve A is opened to allow the negative pressure to be transmitted through the through hole 36a in the support base 30, the cylindrical space defined in the seal ring 38, and the pores in the porous plate 40 and to act on the upper surface 40a of the porous plate 40. The upper surface 40a now functions as a holding surface for holding under suction a plate-shaped workpiece 11 placed thereon. According to the present embodiment, the negative pressure transmitted from the support base 30 acts on the upper surface 40a of the porous plate 40 through fluid passages in the porous plate 40 that are provided only by the pores in the porous plates 40. According to the present embodiment, therefore, it is not necessary to form a plurality of concentric fluid passages in the porous plate 40 as fluid passages for transmitting the negative pressure to act on the upper surface 40a.

A size of the pores in the porous plate 40 are generally smaller than a size of pores in conventional porous members. Specifically, the porous plate 40 includes particles of the porous material that define the pores as interstices, and the particles are more densely packed than the conventional porous members. A difference between the pore sizes appears, for example, as a difference between a gage pressure measured when the workpiece 11 is held under suction on the holding surface while the suction source C is in operation and a gage pressure measured when the workpiece 11 is not held under suction on the holding surface while the suction source C is in operation.

For example, in a case in which a chuck table having a conventional porous member is used, when the workpiece 11 is held under suction on the holding surface while the suction source C is in operation, a gage pressure P1 measured on a lower surface of the porous member is −80 kPa. Furthermore, in the case in which a chuck table having a conventional porous member is used, when the workpiece 11 is not held under suction on the holding surface while the suction source C is in operation, a gage pressure P2 measured on a lower surface of the porous member is −20 kPa. The ratio P2/P1 between magnitudes of the gage pressures P1 and P2 is approximately 25%. With the conventional porous member, therefore, the gage pressure ratio P2/P1 when the workpiece 11 is held on the holding surface and not held on the holding surface is relatively small due to the pore size.

On the other hand, in the case in which the porous plate 40 according to the present embodiment is used, the ratio P2/P1 between the magnitudes of the gage pressures P1 and P2 while the suction source C is in operation is relatively large, ranging from 60% to 80%. The gage pressure P1 represents a gage pressure in the mountable assembly 44, specifically in the through hole 36a, in the case in which the workpiece 11 is held under suction on the holding surface 40a. The gage pressure P1 in the case in which the porous plate 40 according to the present embodiment is used is the same as with the conventional porous member, e.g., −80 kPa.

However, the magnitude of the gage pressure P2 developed in the mountable assembly 44, specifically in the through hole 36a, in the case in which the workpiece 11 is not held under suction on the holding surface 40a is larger than the gage pressure P2 in the case in which the conventional porous member is used. For example, the gage pressure P2 according to the present embodiment is in the range from −48 kPa to −64 kPa. The gage pressures P1 and P2 in the case in which the porous plate 40 according to the present embodiment is used are of values measured when the lower surface 40b and the outer circumferential side surface 40c of the porous plate 40 are not covered with a sealant or the like. The porous plate 40 according to the present embodiment is able to attract the workpiece 11 or the like under suction thereon even if the upper surface 40a is not fully covered. For example, the porous plate 40 according to the present embodiment is able to attract a workpiece under suction on the upper surface 40a even if the workpiece held in contact with the upper surface 40a is smaller in diameter than the upper surface 40a. Consequently, the porous plate 40 can be used to hold under suction workpieces having various many sizes.

For increasing the gage pressure that acts through the through hole 36b on the lower surface 40b of the porous plate 40, a vacuum sealant or film, not illustrated, may be applied to the lower surface 40b of the porous plate 40. The vacuum sealant or film thus applied is effective to secure the lower surface 40b of the porous plate 40 and the upper surface 30a of the support base 30 more reliably to each other. For example, the vacuum sealant or film is applied in an annular shape from an edge of the central recess 46 over sides and a bottom of the annular recess 42 to an area of the lower surface 40b which corresponds to an outer circumferential edge of the upper surface 30a of the support base 30. Particularly, providing the vacuum sealant or film is applied to an area of the lower surface 40b that corresponds to the through hole 36b, the porous plate 40 is reliably attracted under suction and fixed to the support base 30.

Instead of the vacuum sealant or film, fastening members such as clamps or screws may be used to mechanically secure the support base 30 and the porous plate 40 to each other. Alternatively, instead of the vacuum sealant or film, the lower surface 40b of the porous plate 40 may have a plurality of protrusions, not illustrated, that are disposed on an outer circumferential edge of the upper surface 30a when the porous plate 40 is fitted on the support base 30. The protrusions on the lower surface 40b of the porous plate 40 may be mechanically fixed to an outer circumferential side of the support base 30 to secure the porous plate 40 to the upper surface 30a of the support base 30. When the porous plate 40 is fitted on the support base 30, the annular recesses 32 and 42 jointly define an annular cavity. The annular recesses 32 and 42 make it possible to make a region in which surface roughness of the upper surface 30a and the lower surface 40b needs to be equal to or lower than a predetermined value, smaller than if it were not for the annular recesses 32 and 42. Accordingly, the upper surface 30a and the lower surface 40b can be machined with ease.

Referring back to FIG. 1, other structural details of the laser processing apparatus 2 will be described below. A support arm 50 that extends forwardly projects from an upper front surface of the wall 4b. A laser beam applying unit 52, i.e., a processing unit, is mounted on a distal end of the support arm 50 in overhanging relation to the porous plate 40. The laser beam applying unit 52 is able to apply a laser beam substantially perpendicularly to the workpiece 11 held on the upper surface 40a of the porous plate 40. The laser beam has a wavelength of, e.g., 355 nm, that is absorbable by a silicon wafer, for example. However, the laser beam may have a wavelength of, e.g., 1342 nm, that is transmittable through a silicon wafer, for example.

An image capturing unit 54 is mounted on the distal end of the support arm 50 at a position adjacent to the laser beam applying unit 52. The image capturing unit 54 is a camera, for example, including a light source for applying visible light to the workpiece 11 held on the upper surface 40a of the porous plate 40 and an image capturing element for receiving reflected light from the workpiece 11. An image captured of the workpiece 11 by the image capturing unit 54 will be used in positionally aligning the workpiece 11 and the laser beam applying unit 52 with each other. The workpiece 11 is made of silicon or the like and is of a disk shape. The workpiece 11 has a face side demarcated into a plurality of areas by a grid of projected dicing lines, not illustrated, with devices, not illustrated, such as integrated circuits (ICs) or large-scale-integration (LSI) circuits formed in the respective areas. When the workpiece 11 is divided along the projected dicing lines, the workpiece 11 is separated into a plurality of device chips having the respective devices. The workpiece 11 is not limited to any particular materials, shapes, structures, sizes, and so on. For example, the workpiece 11 may be made of a semiconductor such as GaAs, InP, GaN, or SiC other than silicon, or sapphire, glass, or the like. The devices are not limited to any particular types, quantities, shapes, structures, sizes, layouts, and so on.

Figure 2B:
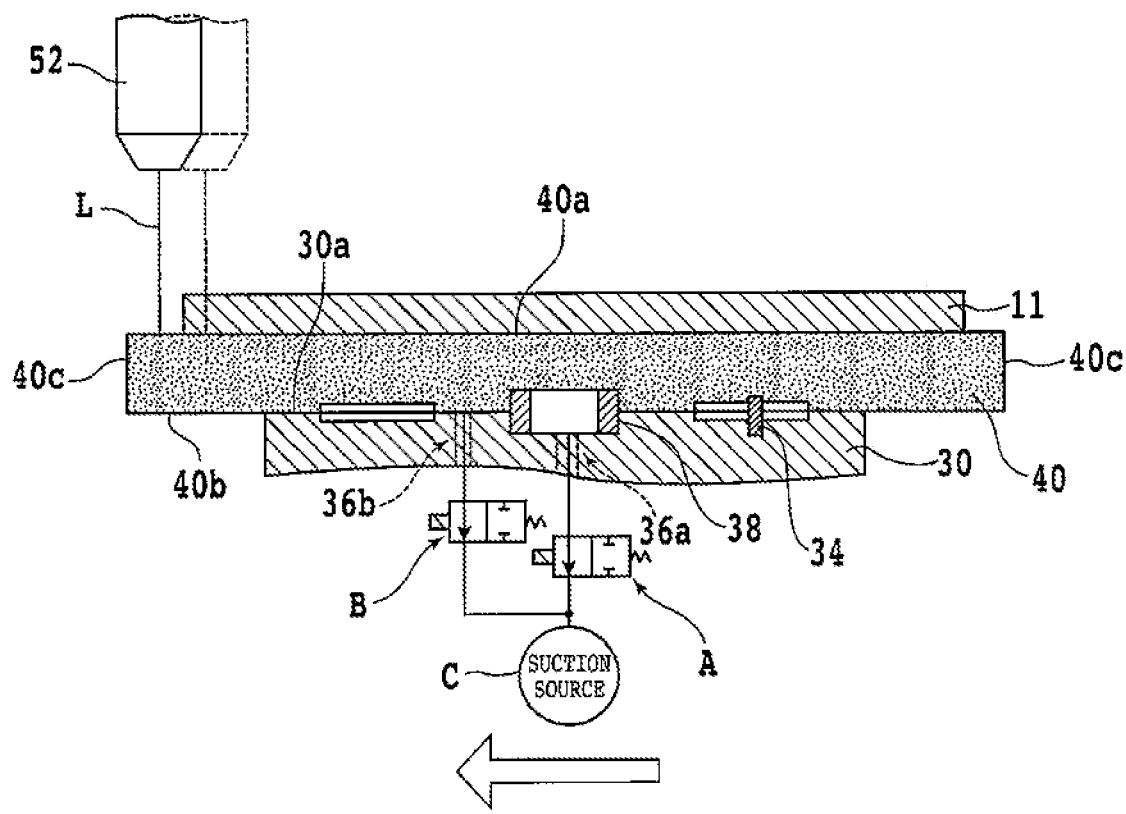
FIG. 2B is a side elevational view, partly in cross section, of the porous plate etc., illustrating a manner in which a workpiece is processed by a laser beam applying unit.

A method of processing the workpiece 11 by applying the laser beam thereto on the laser processing apparatus 2 will be described below. FIG. 2B illustrates in side elevation, partly in cross section, the porous plate 40 etc., illustrating a manner in which the workpiece 11 is processed by the laser beam applying unit 52. First, while the porous plate 40 is being attracted under suction to the upper surface 30a of the support base 30, the first solenoid-operated valve A is opened to allow the negative pressure to act on the upper surface 40a of the porous plate 40. Then, when the workpiece 11 is placed on the upper surface 40a of the porous plate 40, the workpiece 11 is held under suction on the upper surface 40a (holding step).

Thereafter, a projected dicing line on the workpiece 11 is detected using the image capturing unit 54 etc. (alignment step). Next, the rotary actuator is operated to rotate the porous plate 40, i.e., the chuck table, about its own central axis to position the projected dicing line on the workpiece 11 parallel to the X-axis directions of the laser processing apparatus 2. While the laser beam applying unit 52 is applying a laser beam L to the workpiece 11, the porous plate 40 and the laser beam applying unit 52 are moved relatively to each other along one of the X-axis directions by the moving assembly 6, thereby processing the workpiece 11 (processing step).

Since the chuck table, i.e., the porous plate 40, according to the present embodiment is free of a frame of metal or the like, but is formed from a porous material only, the chuck table is much lighter than conventional chuck tables having frames. Consequently, even if the chuck table increases in size, a load imposed on the moving assembly 6 by the chuck table is low. For example, even if the moving assembly 6 is of the conventional nature, it can move the porous plate 40 at a high speed of approximately 1 m/s.

In a case in which the porous plate 40 is formed from porous glass, since the laser beam L that has been transmitted through the workpiece 11 is also transmitted through the porous plate 40, any damage caused to the porous plate 40 by the laser beam L is minimized. The porous plate 40 may alternatively be formed from porous ceramic rather than porous glass. The porous plate 40 may include an electrically conductive material such as silicon or carbon. The electrically conductive material forms an electrically conductive path from the upper surface 40*a* to the mountable assembly 44, e.g., the lower surface 40*b*, i.e., widthwise across the porous plate 40. In the case in which the porous plate 40 is electrically conductive, the porous plate 40 may be used as a chuck table of a dicing apparatus, not illustrated, including a cutting unit, i.e., a processing unit, that includes a cutting blade having an annular electrically conductive cutting edge. By electrically connecting the porous plate 40 and the cutting blade to each other, it is possible to perform a set-up operation for detecting a reference height for the cutting blade.

Figure 3:
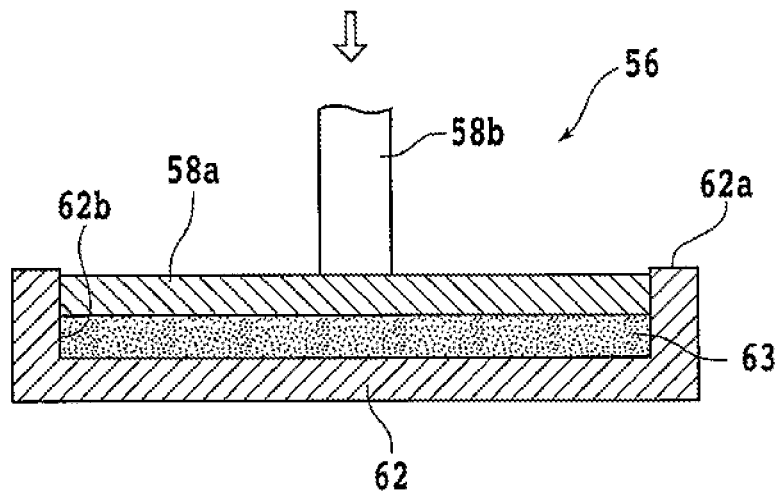
FIG. 3 is a view illustrating a molding step.
Figure 6:
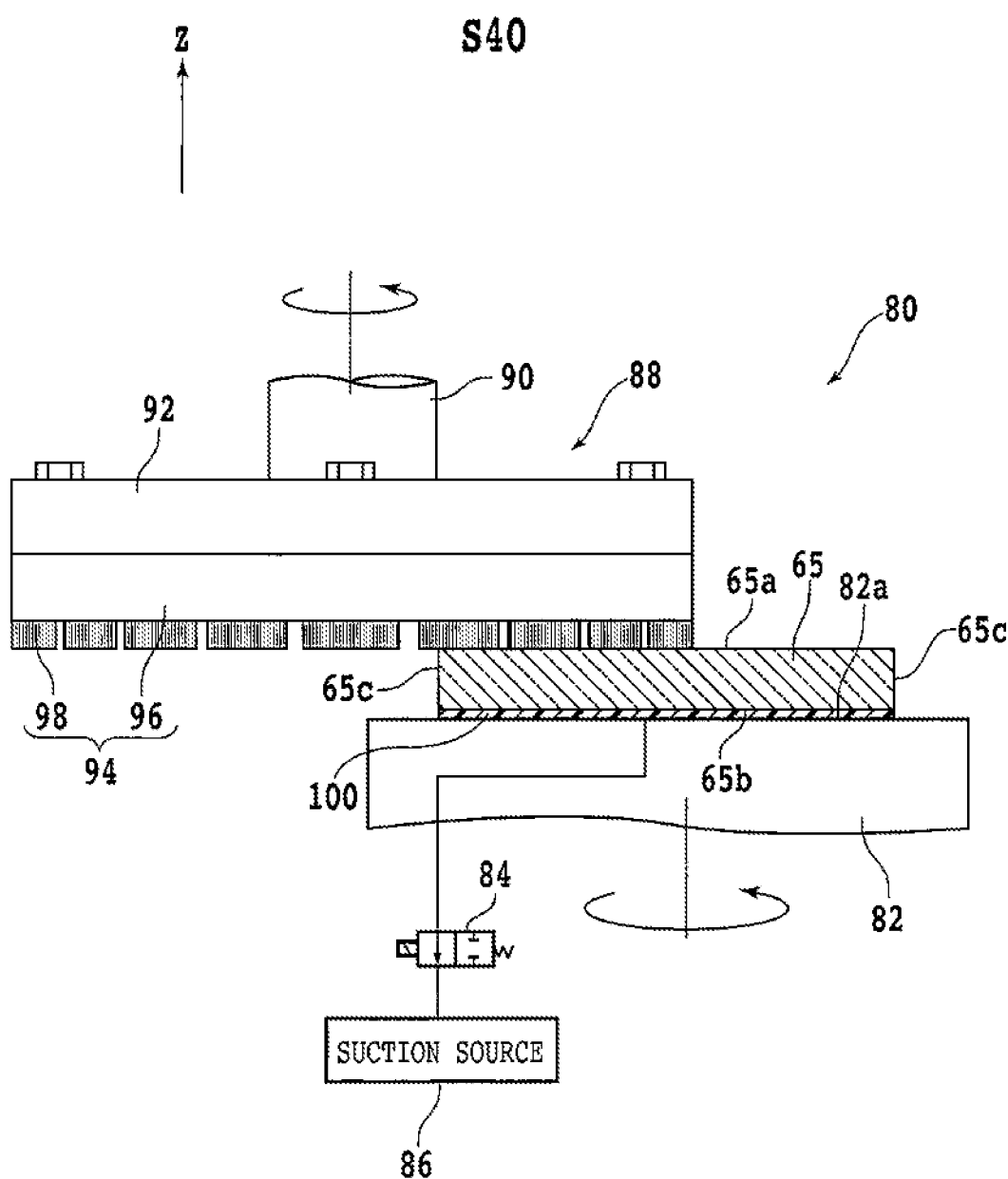
FIG. 6 is a view illustrating a grinding step.
Figure 7A:
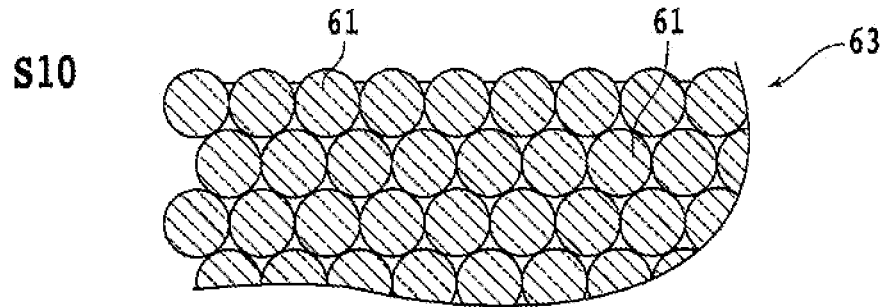
FIG. 7A is a cross-sectional view of glass particles etc. after the molding step.

Next, a method of manufacturing the porous plate 40 will be described below with reference to FIGS. 3 through 8. FIG. 8 is a flowchart of a method of manufacturing the porous plate 40. First, a case of manufacturing the porous plate 40 from glass particles made of any of various types of glass including soda glass, borosilicate glass, and the like will be described below. A particle group of glass particles 61 (see FIGS. 7A through 7D), i.e., particulate glass, is molded by a mold 62 (see FIG. 3), forming a compact 63 (molding step S10). FIG. 3 illustrates the molding step S10.

The glass particles 61 are substantially spherical in shape each and have substantially the same diameter. The glass particles 61 should preferably be dense particles free of air bubbles therein. The glass particles 61 can be fabricated by spray drying, for example, on a spray drier. The spray drier has a nozzle for atomizing a liquid of raw glass. The nozzle atomizes the liquid of raw glass into fine particles of liquid glass that remain spherical in shape due to surface tension. In a drying chamber, the fine particles of liquid glass are exposed to hot air introduced into the drying chamber, and solidified into spherical even-diameter glass particles 61.

According to the present embodiment, the glass particles 61 have diameters selected in a predetermined range from 3 μm to 4 mm. The diameters of the glass particles 61 are selected preferably in a range from 5 μm to 300 μm or more preferably in a range from 30 μm to 200 μm. The diameters of the glass particles 61 are uneven according to the Gaussian distribution. In a case in which the diameters of the glass particles 61 are of values equal to or smaller than 100 μm, for example, then a particle group of glass particles 61 whose diameters have a standard deviation of 5 μm or less is used. In a case in which the diameters of the glass particles 61 are of values ranging from 101 μm to 300 μm, then a particle group of glass particles 61 whose diameters have a standard deviation of 10 μm or less is used.

The mold 62 is shaped as a hollow cylindrical receptacle made of metal or ceramic. The mold 62 has a disk-shaped cavity 62*b* defined therein that is complementary in shape to the porous plate 40. The cavity 62*b* extends from an annular surface 62*a* of the mold 62 to a predetermined depthwise position in the mold 62. In the molding step S10, the cavity 62*b* in the mold 62 is supplied with glass particles 61 until they pile up beyond the annular surface 62*a* of the mold 62. Next, those glass particles 61 that have exceeded the annular surface 62*a* of the mold 62 are removed by a squeegee, not illustrated, that is a scraping plate-shaped tool of rubber or metal.

Thereafter, the particle group of glass particles 61 in the cavity 62*b* is compressed by a compression molding apparatus 56. The compression molding apparatus 56 has a disk-shaped plate-like pressing member 58*a* complementary in shape to the space of the cavity 62*b* and a pressing shaft 58*b* for pressing the plate-like pressing member 58*a* downwardly. Using the compression molding apparatus 56, the particle group of glass particles 61 in the cavity 62*b* is compressed into a compact 63 in which the particle group of glass particles 61 in the cavity 62*b* is molded into the shape of the porous plate 40.

Figure 4:
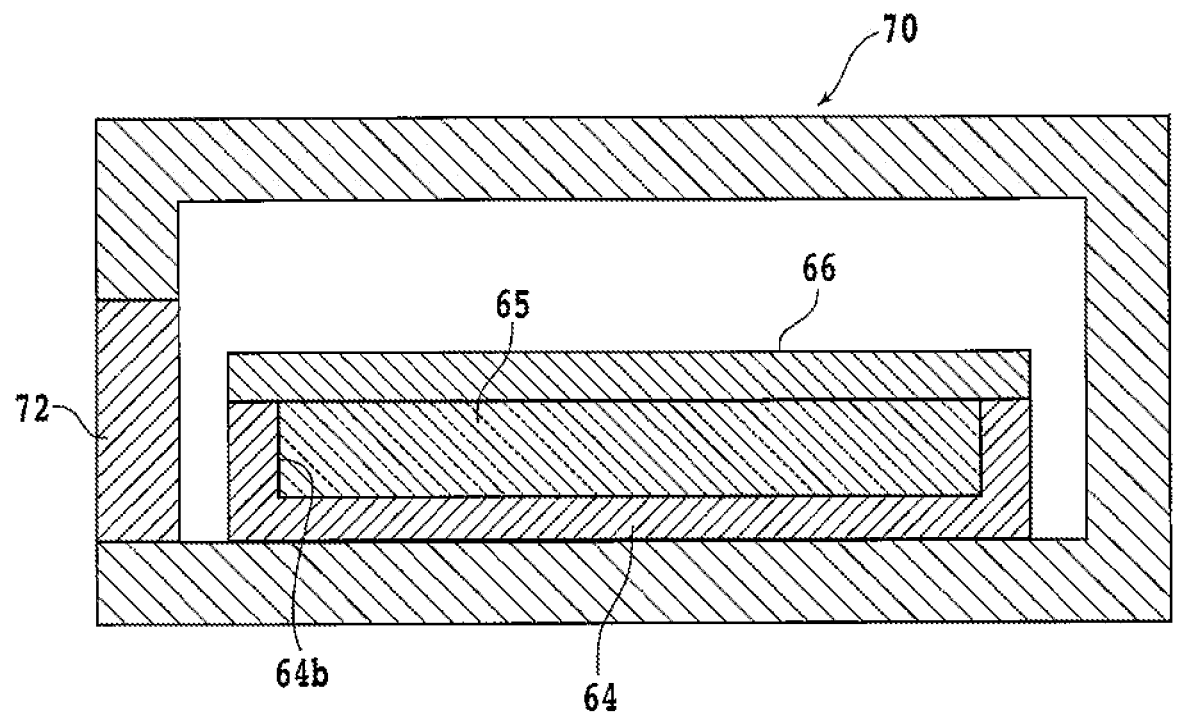
FIG. 4 is a view illustrating a sintering step.

After the molding step S10, the compact 63 is sintered into a sintered body 65 in a sintering furnace 70 (see FIG. 4) (sintering step S20). FIG. 4 illustrates the sintering step S20. In the sintering step S20, the compact 63 is taken out of the mold 62 and put into a cavity 64*b* in a hollow cylindrical receptacle 64 made of metal or ceramic that can withstand sintering at a high temperature of 1300° C. or higher. Thereafter, a disk-shaped lid plate 66 made of the same metal or ceramic as the receptacle 64 is placed on the receptacle 64, confining the compact 63 in the receptacle 64 covered with the lid plate 66. Then, the receptacle 64 and the lid plate 66 with the compact 63 confined therein are put into the sintering furnace 70 through an opening/closing door 72, after which the compact 63 is sintered.

The compact 63 is sintered at a predetermined sintering temperature in a range from 600° C. to 1300° C., for example. According to the present embodiment, the sintering temperature ranges from 700° C. to 800° C. in excess of a softening point of the glass particles 61. When the compact 63 is thus sintered, it is turned into the sintered body 65 in which the interstices between the glass particles 61 remain as pores and the adjacent ones of the spherical glass particles 61 are partially connected to each other. In a case in which the glass particles 61 are made of quartz glass, since the softening point of quartz glass is approximately 1650° C., they are sintered at a predetermined sintering temperature in a range from 1600° C. to 1700° C.

Figure 5:
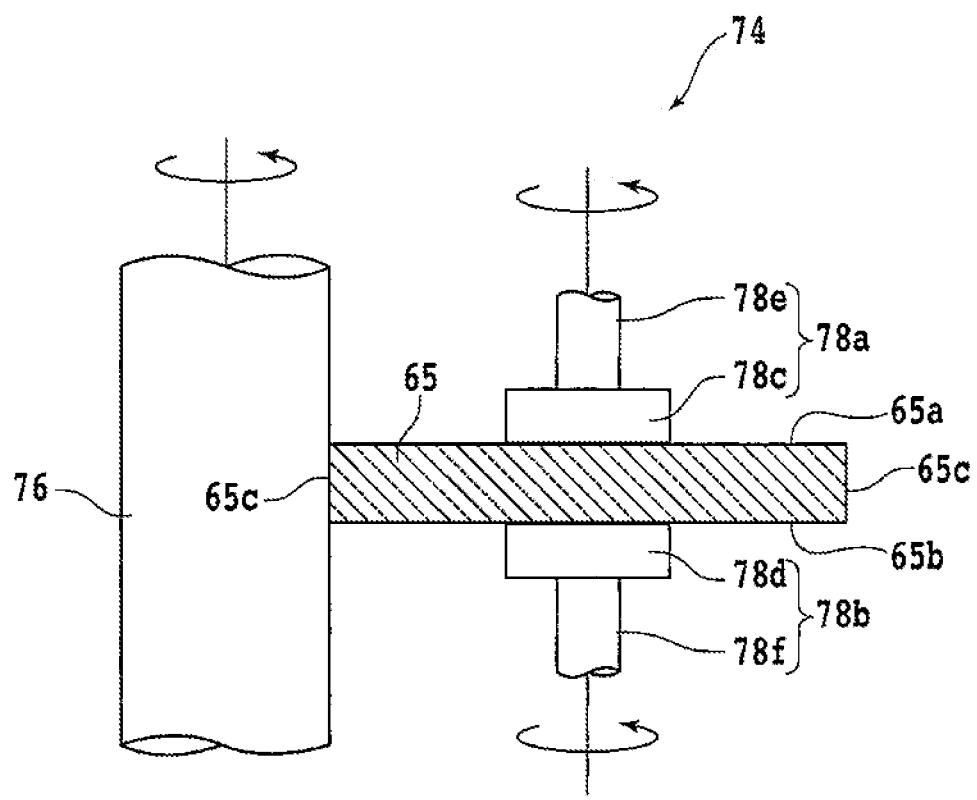
FIG. 5 is a view illustrating a polishing step.

The compact 63 is sintered for a sintering time ranging from 30 minutes to 3 hours, for example. The longer the sintering time is, the longer the time in which the glass material of the glass particles 61 is softened and flowable is. Therefore, an area of contact between the glass particles 61 increases, and a porosity of the sintered body 65, i.e., a proportion of a volume of the pores in a volume of the sintered body 65, decreases. For example, the porosity of the sintered body 65 in the case of the sintering time of 3 hours is lower than the porosity of the sintered body 65 in the case of the sintering time of 30 minutes. After the sintering step S20, an outer circumferential side surface of the sintered body 65 is polished or ground, thereby correcting the shape of the sintered body 65 (polishing step S30). FIG. 5 illustrates the polishing step S30. In the polishing step S30, an outer circumferential side surface 65c of the sintered body 65 is polished by a hollow cylindrical polishing apparatus 74.

The hollow cylindrical polishing apparatus 74 has a hollow cylindrical grinding stone 76 having a hollow cylindrical shape. The hollow cylindrical grinding stone 76 includes on its side surface a grinding stone made of abrasive grains of diamond, cubic boron nitride (CBN), or the like mixed with a bonding material, i.e., a binder, of metal, ceramic, resin, or the like. The hollow cylindrical grinding stone 76 includes a hollow cylindrical central shaft having an end connected to an actuator such as an electric motor. The hollow cylindrical grinding stone 76 is rotatable about a central axis of the hollow cylindrical central shaft by the actuator. The hollow cylindrical polishing apparatus 74 also has a pair of rotary grippers 78a and 78b disposed adjacent to the hollow cylindrical grinding stone 76. The rotary grippers 78a and 78b are disposed in axial alignment with each other. The sintered body 65 is gripped between the rotary grippers 78a and 78b.

The rotary gripper 78a has a presser 78c of a disk shape that is smaller in diameter than a circular surface 65a of the sintered body 65, the presser 78c being held in contact with the circular surface 65a of the sintered body 65. A cylindrical rotor 78e having a central axis parallel to the central shaft of the hollow cylindrical grinding stone 76 is connected to a surface of the presser 78c that is opposite to the surface thereof that is held in contact with the circular surface 65a of the sintered body 65. Similarly, the rotary gripper 78b has a presser 78d of a disk shape that is smaller in diameter than another circular surface 65b of the sintered body 65, the presser 78d being held in contact with the other circular surface 65b of the sintered body 65. A cylindrical rotor 78f having a central axis parallel to the central shaft of the hollow cylindrical grinding stone 76 is connected to a surface of the presser 78d that is opposite to the surface thereof that is held in contact with the other circular surface 65b of the sintered body 65.

The pressers 78c and 78d are pushed toward each other until they grip both surfaces 65a and 65b of the sintered body 65 therebetween, and then the rotors 78e and 78f are rotated about their central axes to rotate the sintered body 65. The grinding stone of the hollow cylindrical grinding stone 76 that is rotating about the central axis of the hollow cylindrical central shaft thereof is then brought into contact with the outer circumferential side surface 65c of the rotating sintered body 65, thereby polishing or grinding the outer circumferential side surface 65c. After the polishing step S30, the surfaces 65a and 65b of the sintered body 65 are successively ground by a grinding apparatus 80 (grinding step S40). FIG. 6 illustrates the grinding step S40.

The grinding apparatus 80 has a chuck table 82. The chuck table 82 is of a conventional type having a frame and a porous plate, not illustrated, of a porous structure disposed in a recess defined in the frame. The frame of the chuck table 82 has a fluid passage, not illustrated, defined therein that is held in fluid communication with the porous plate and also with a suction source 86 such as an ejector through a solenoid-operated valve 84. When the solenoid-operated valve 84 is opened, a negative pressure from the suction source 86 is transmitted through the fluid passage and acts on an upper surface of the porous plate, causing the upper surface of the porous plate to function as a holding surface 82a of the chuck table 82.

A rotary actuator, not illustrated, is disposed below and connected to the chuck table 82. When the rotary actuator is energized, it rotates the chuck table 82 about a straight central axis parallel to the Z-axis. The grinding apparatus 80 also has a grinding unit 88 disposed above the chuck table 82. The grinding unit 88 includes a spindle housing, not illustrated, that is fixed to a lifting and lowering mechanism, not illustrated, that lifts and lower the spindle housing along the Z-axis.

The spindle housing houses part of a spindle 90 as a rotational shaft generally parallel to the Z-axis so as to be rotatable about its own central axis. A disk-shaped wheel mount 92 made of stainless steel or the like is fixed to a lower end of the spindle 90. The wheel mount 92 has a lower surface on which a grinding wheel 94 is fixedly mounted. The grinding wheel 94 is of substantially the same diameter as the wheel mount 92. The grinding wheel 94 includes an annular wheel base 96 made of stainless steel or the like.

The wheel base 96 has an upper surface fixed to the wheel mount 92, and hence is coupled to the spindle 90. A plurality of grinding stones 98 are mounted on an annular lower surface of the wheel base 96 which is opposite the upper surface thereof. For grinding the surface 65a of the sintered body 65 in the grinding step S40, a protective sheet 100 that is of a circular shape substantially equal in diameter to the sintered body 65 and that is made of resin is affixed to the other surface 65b of the sintered body 65. The other surface 65b of the sintered body 65 with the protective sheet 100 affixed thereto is then placed on the holding surface 82a of the chuck table 82. Then, the suction source 86 is actuated, and the solenoid-operated valve 84 is opened to hold the sintered body 65 under suction on the holding surface 82a.

Next, while the chuck table 82 and the spindle 90 are being rotated in the same direction, the lifting and lowering mechanism is operated to lower the grinding wheel 94. When the grinding wheel 94 is lowered, the grinding stones 98 are pressed against the surface 65a of the sintered body 65, grinding the surface 65a to planarize the same. Then, the chuck table 82 is stopped from rotating, and the solenoid-operated valve 84 is closed, after which the sintered body 65 is taken down from the holding surface 82a. The protective sheet 100 is removed from the other surface 65b of the sintered body 65, and a new protective sheet 100 is affixed to the surface 65a of the sintered body 65.

The solenoid-operated valve 84 is opened to hold the surface 65a of the sintered body 65 with the new protective sheet 100 affixed thereto under suction on the holding surface 82a. The other surface 65b of the sintered body 65 is then ground by the grinding unit 88. Both of the surfaces 65a and 65b of the sintered body 65 are now planarized. After the grinding step S40, the surface 65a or the surface 65b of the sintered body 65 is cut by a drill or the like, forming the annular recess 42 and the fittable assembly, i.e., the pin dent or dents 42a and the central recess 46 in the surface 65a or the surface 65b (fitting assembly forming step S50). The porous plate 40, i.e., a chuck table, referred to above, is thus manufactured.

The porous plate 40 according to the present embodiment is used as a chuck table not fixed to a frame but mounted on the upper surface 30a of the support base 30. Consequently, it is not necessary to secure the porous plate 40 to a frame and polish the frame and the porous plate 40. Therefore, it is easier to polish the porous plate 40 than to polish conventional chuck tables using frames. Next, changes brought about in the particle group of glass particles 61 from the molding step S10 to the grinding step S40 will be described below. FIG. 7A illustrates in cross section the glass particles 61 etc. after the molding step S10. In FIG. 7A, some of the glass particles 61 are schematically illustrated as circles.

Figure 7B:
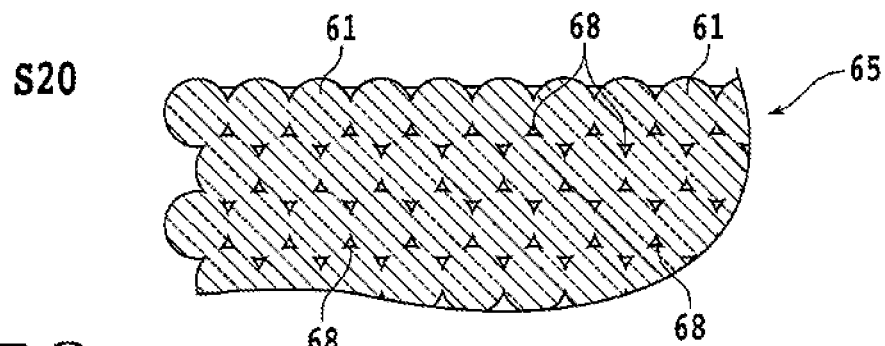
FIG. 7B is a cross-sectional view of glass particles etc. after the sintering step.
Figure 8:
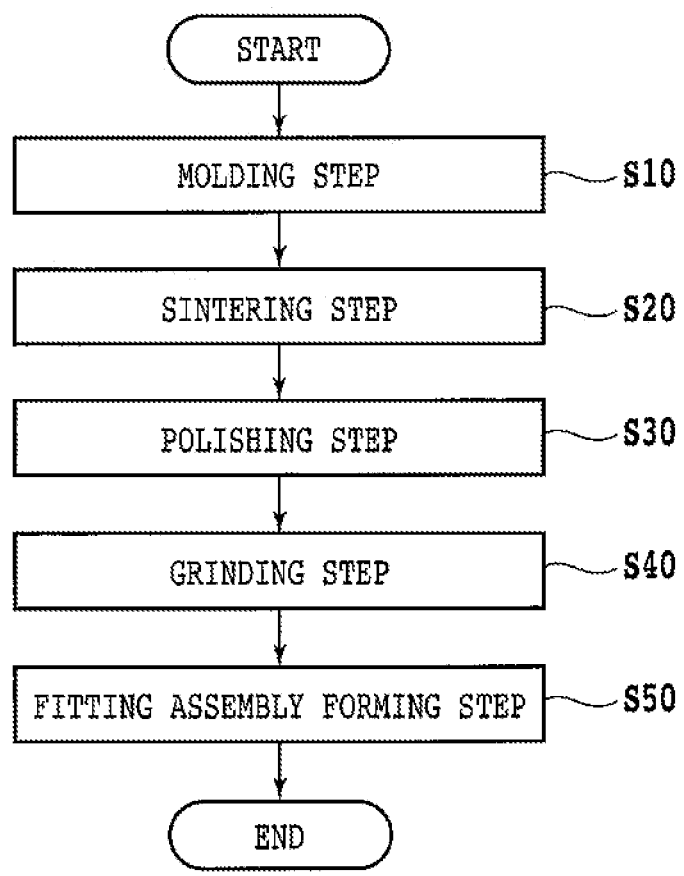
FIG. 8 is a flowchart of a method of manufacturing a porous plate.

FIG. 7B illustrates in cross section the glass particles 61 etc. after the sintering step S20. In the sintering step S20, as described above, the compact 63 is sintered at a predetermined temperature ranging from 700° C. to 800° C. for a sintering time ranging from 30 minutes to 3 hours. Sintering in the sintering step S20 is finished while the interstices are being left between the glass particles 61. The adjacent ones of the spherical glass particles 61 are connected, and the interstices left between the glass particles 61 become pores 68. The pores 68 are spatially coupled to each other, defining fluid passages for a gas from the surface 65*a* to the surface 65*b* of the sintered body 65.

Figure 7C:
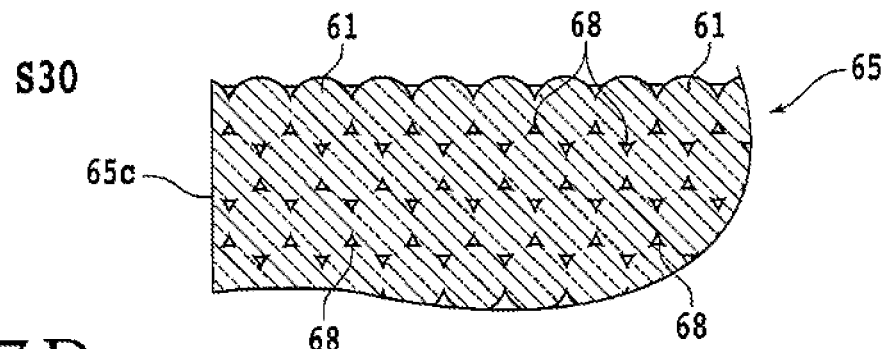
FIG. 7C is a cross-sectional view of a sintered body after the polishing step.
Figure 7D:
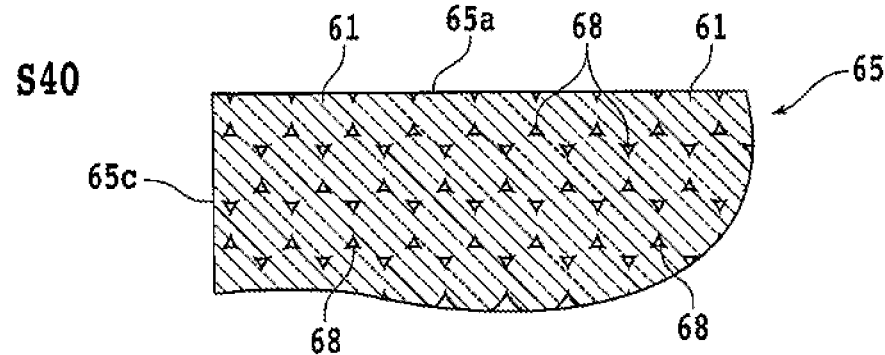
FIG. 7D is a cross-sectional view of the sintered body after the grinding step.

FIG. 7C illustrates in cross section the sintered body 65 after the polishing step S30. In the polishing step S30, the outer circumferential side surface 65*c* of the sintered body 65 is polished or ground. FIG. 7D illustrates in cross section the sintered body 65 after the grinding step S40. In the grinding step S40, the surface 65*a* and the surface 65*b* of the sintered body 65 are ground. In this manner, the porous plate 40 according to the first embodiment is completed. In the porous plate 40, the fluid passages through which the negative pressure transmitted from the support base 30 acts on the upper surface 40*a* are provided only by the pores 68 in the porous plates 40. Therefore, it is not necessary to form annular suction passages and a hollow cylindrical suction channel in the porous plate 40.

(First Modification)

Some alternatives to the molding step S10 will be described as a first modification below. In the molding step S10, the particle group of glass particles 61 may be mixed with frit, not illustrated, as a powder of glass made of the same glass material as the glass particles 61 and including particles smaller in diameter than the glass particles 61. The frit may be made of a glass material different from the glass particles 61. However, it is desirable for the frit to have a melting point that is the same as or lower than the glass particles 61. Using the frit, the porosity may be made lower than if no frit is used providing the compact is sintered at the same sintering temperature for the same sintering time.

In the molding step S10, a compact having a pore forming material in the form of organic particles, not illustrated, may be formed. The pore forming material has an average particle diameter ranging from 100 μm to 150 μm, for example. In the sintering step S20, the pore forming material is vaporized to form the pores 68 in the porous plate 40. Using the pore forming material, the porosity may be made higher than if no pore forming material is used providing the compact is sintered at the same sintering temperature for the same sintering time. Furthermore, in the molding step S10, a compact having a dispersant that includes an organic solvent etc. may be formed. The dispersant is used to cause the glass particles, the frit, the pore forming material, or the like to be dispersed uniformly in the compact. Moreover, in the molding step S10, a compact including an electrically conductive material in a range from 5 vol. % to 20 vol. % may be formed. The electrically conductive material may be in the form of fine particles, a powder, or the like of silicon, carbon, or the like. The electrically conductive material has a lower electric resistance than the glass particles 61 or an aggregate to be described later even after the sintering step S20.

(Second Modification)

Other examples of the material of the porous plate 40 will be described below. According to the first embodiment, the porous plate 40 is formed of the glass particles 61. However, a porous plate may be manufactured from a powder of glass made of soda glass, borosilicate glass, quartz glass, or the like, whose particles have a representative length of less than 100 μm. Alternatively, a porous plate may be formed from ceramic using an aggregate of alumina, silicon carbide, zirconia, or the like. By forming the porous plate 40 of ceramic, the porous plate is made lighter than if the porous plate 40 is formed from the glass particles 61.

The particle group of the aggregate can be obtained by sieving a particle group of ceramic having particle diameters in a predetermined range, using a metal mesh having a mesh aperture of 355 μm. In the molding step S10, the particle group of the aggregate, a bonding material, and a pore forming material are mixed together and molded into the compact 63. The ratio at which the aggregate, the bonding material, and the pore forming material are mixed is appropriately determined depending on performance of the porous plate to be manufactured.

Thereafter, the compact 63 is sintered (sintering step S20). In the sintering step S20, the compact 63 is sintered at a sintering temperature in a range from 800° C. to 1000° C. for a sintering time of 10 hours, for example. The sintering temperature and the sintering time may be appropriately adjusted depending on the ceramic material, the porosity, etc. Thereafter, the polishing step S30, the grinding step S40, and the fitting assembly forming step S50 are carried out to form a porous plate of ceramic.

(Third Modification)

Next, a modification of the grinding step S40 will be described below. In the grinding step S40, the sintered body 65 may be ground by a horizontal-shaft grinding apparatus, not illustrated. The horizontal-shaft grinding apparatus includes a support base, not illustrated, for supporting an object to be ground and an annular grinding stone, not illustrated, for grinding the object to be ground that is placed on the support base. The annular grinding stone has a through hole, not illustrated, defined centrally therein for a cylindrical spindle, not illustrated, to extend therethrough. The cylindrical spindle has an end fixedly disposed in the through hole. The spindle has another end coupled to an actuator, not illustrated, such as an electric motor.

In the case in which the horizontal-shaft grinding apparatus is used, in the grinding step S40, a protective sheet, not illustrated, of resin is affixed to the one surface 65*a* of the sintered body 65, and the one surface 65*a* with the protective sheet affixed thereto is placed on the support base. The actuator is operated to rotate the grinding stone, and a side face of the grinding stone is brought into contact with the other surface 65*b* of the sintered body 65. At this time, the grinding stone and the support base are moved in predetermined directions while the grinding stone is being rotated, so that the other surface 65*b* will be ground in its entirety.

(Fourth Modification)

A modification of the fitting assembly forming step S50 will be described below. According to a method of manufacturing the porous plate 40, the fitting assembly forming step S50 may be dispensed with, and the fittable assembly having the annular recess 42 and the central recess 46 may be formed in the molding step S10. Specifically, the mold 62 has on its bottom an annular protrusion, not illustrated, formed complementarily to the annular recess 42, a first columnar protrusion, not illustrated, formed complementarily to the pin dent or dents 42*a*, and a second columnar protrusion, not illustrated, formed complementarily to the central recess 46. Then, the glass particles 61 etc. that have filled in the cavity 62*b* in the mold 62 are compressed by the plate-like pressing member 58*a*. Thereafter, the sintering step S20 is carried out to form the annular recess 42, the pin dent or dents 42*a*, and the central recess 46.

Figure 9:
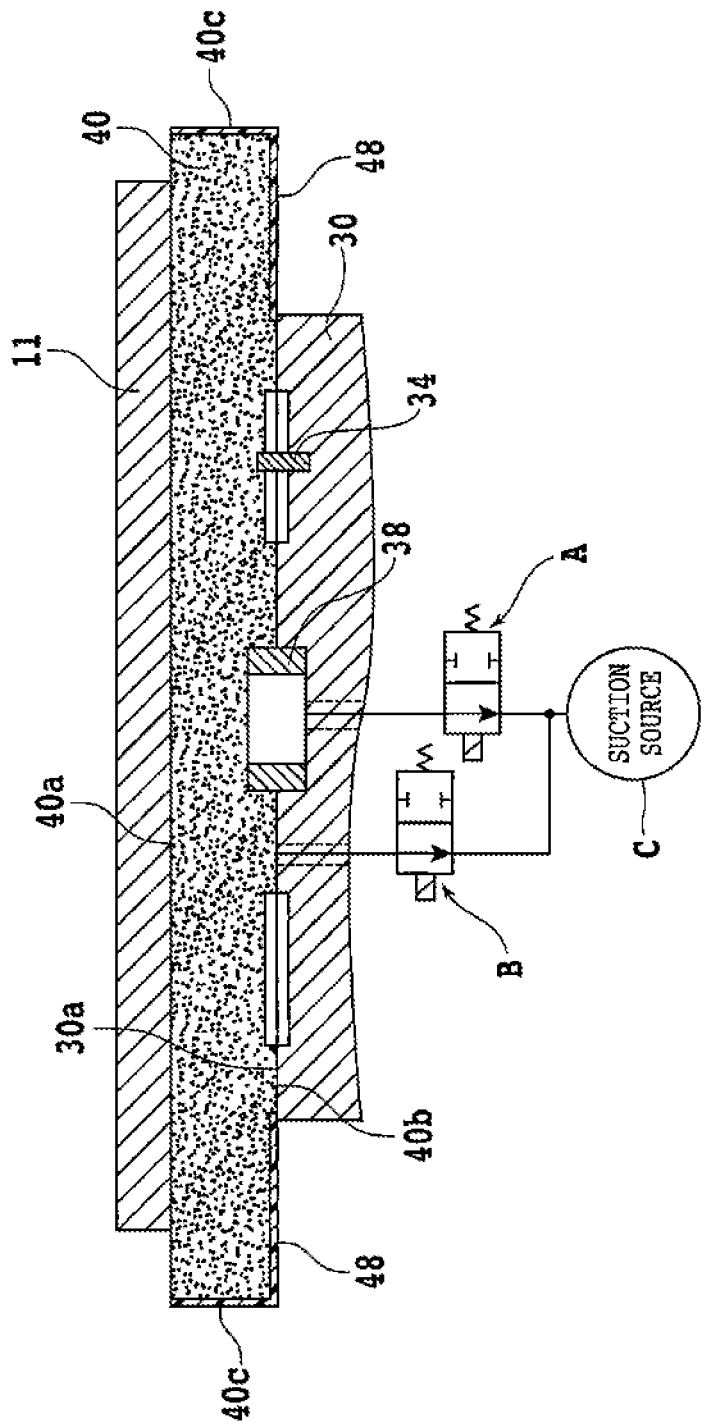
FIG. 9 is a side elevational view, partly in cross section, of a porous plate etc. according to a second embodiment of the present invention.

A porous plate 40 according to a second embodiment of the present invention will be described below. FIG. 9 illustrates in side elevation, partly in cross section, the porous plate 40 etc. according to the second embodiment. The porous plate 40 according to the second embodiment has the outer circumferential side surface 40c and an outer circumferential portion of the lower surface 40b covered with a sealant 48. The outer circumferential portion of the lower surface 40b refers to a region of the lower surface 40b that is positioned radially outwardly of the annular recess 42, for example. By covering the outer circumferential side surface 40c and the outer circumferential portion of the lower surface 40b with the sealant 48, the magnitude of the gage pressure P2 is made larger than if the region is not covered with the sealant 48. However, even if the region is not covered with the sealant 48, the porous plate 40 sufficiently functions as a chuck table where a negative pressure is developed in the upper surface 40a.

Figure 10:
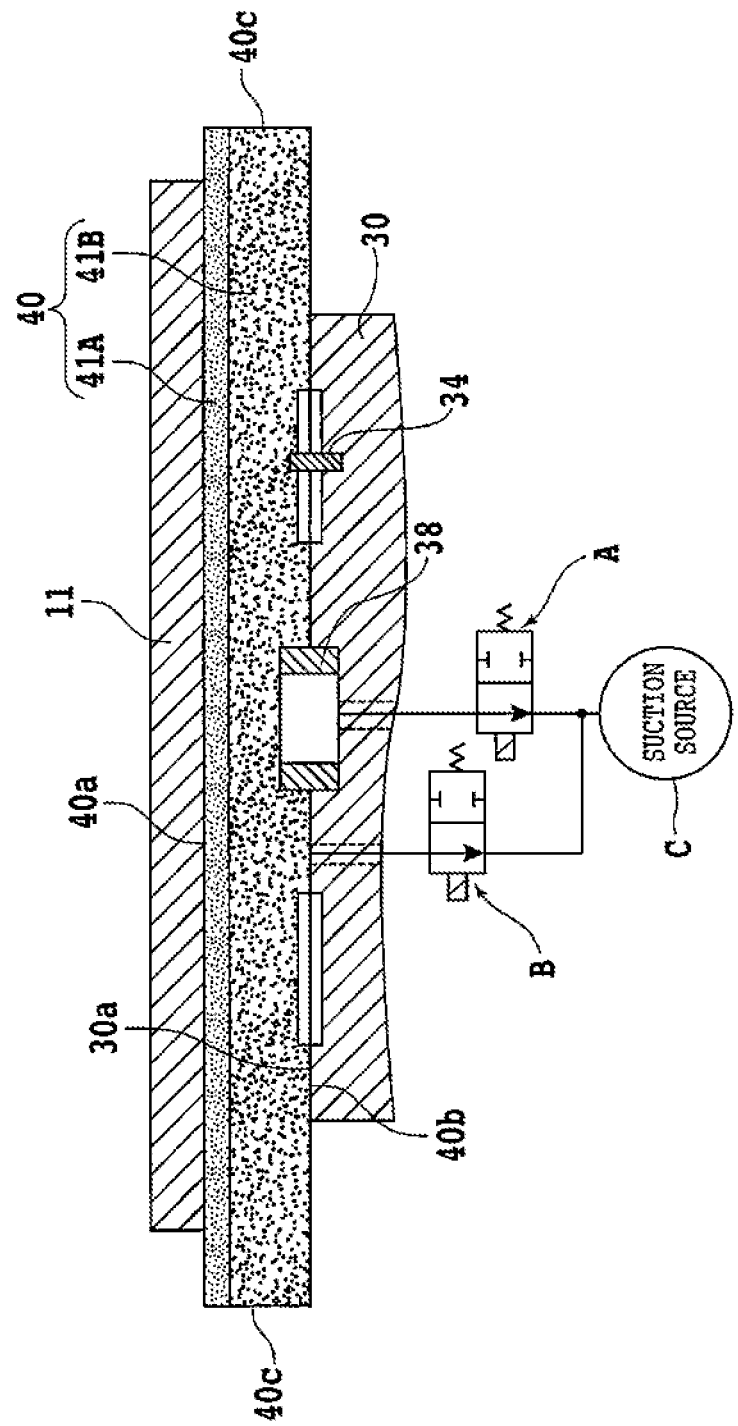
FIG. 10 is a side elevational view, partly in cross section, of a porous plate etc. according to a third embodiment of the present invention.

Next, a third embodiment will be described below. A porous plate 40 according to the third embodiment has a first region 41A positioned on an upper surface 40a side and a second region 41B positioned on a mountable assembly 44 side. FIG. 10 illustrates in side elevation, partly in cross section, the porous plate 40 etc. according to the third embodiment. The first region 41A is formed from glass particles 61 or a particle group of an aggregate or the like having a predetermined size, and the second region 41B is formed of glass particles 61 or a particle group of an aggregate or the like having a particle diameter larger than the first region 41A. Therefore, the second region 41B has pores 68 larger than pores 68 in the first region 41A.

With the porous plate 40 according to the third embodiment, the upper surface 40a of the first region 41A that has the relatively small pores 68 therein is held in contact with the workpiece 11. Consequently, the size of the pores 68, i.e., openings, that are exposed on the upper surface 40a is reduced compared with the case in which the second region 41B that has the relatively large pores 68 therein is disposed on the upper surface 40a side. In a case in which the porous plate 40 is used as the chuck table of a cutting apparatus, for example, and the workpiece 11 held under suction on the porous plate 40 is cut by the cutting apparatus, the size of chippings, i.e., broken fragments, produced from the workpiece 11 is reduced.

For forming the porous plate 40 according to the third embodiment, a particle group from which the second region 41B is to be formed may be supplied to fill the mold 62 up to a predetermined depth, and thereafter a particle group from which the first region 41A is to be formed may be supplied to fill the mold 62 in the molding step S10. Each of the porous plates 40 according to the first through third embodiments is used as a chuck table for holding the workpiece 11 under suction thereon while one surface of the workpiece 11 is held in contact with the upper surface 40a of the porous plate 40, for example.

However, the workpiece 11 may be held under suction on the upper surface 40a with a protective tape of resin interposed therebetween. In this case, a workpiece unit including the workpiece 11, the protective tape 13, and an annular frame 15 is placed on the upper surface 40a (see FIG. 11). The protective tape 13 is of a larger diameter than the workpiece 11. The protective tape 13 is of a layered structure including a base layer of resin and an adhesive layer of resin, for example, with the adhesive layer being affixed to the workpiece 11. The annular frame 15 is made of metal and has an opening that is larger in diameter than the workpiece 11, and is affixed to an outer circumferential portion of the protective tape 13.

Figure 11:
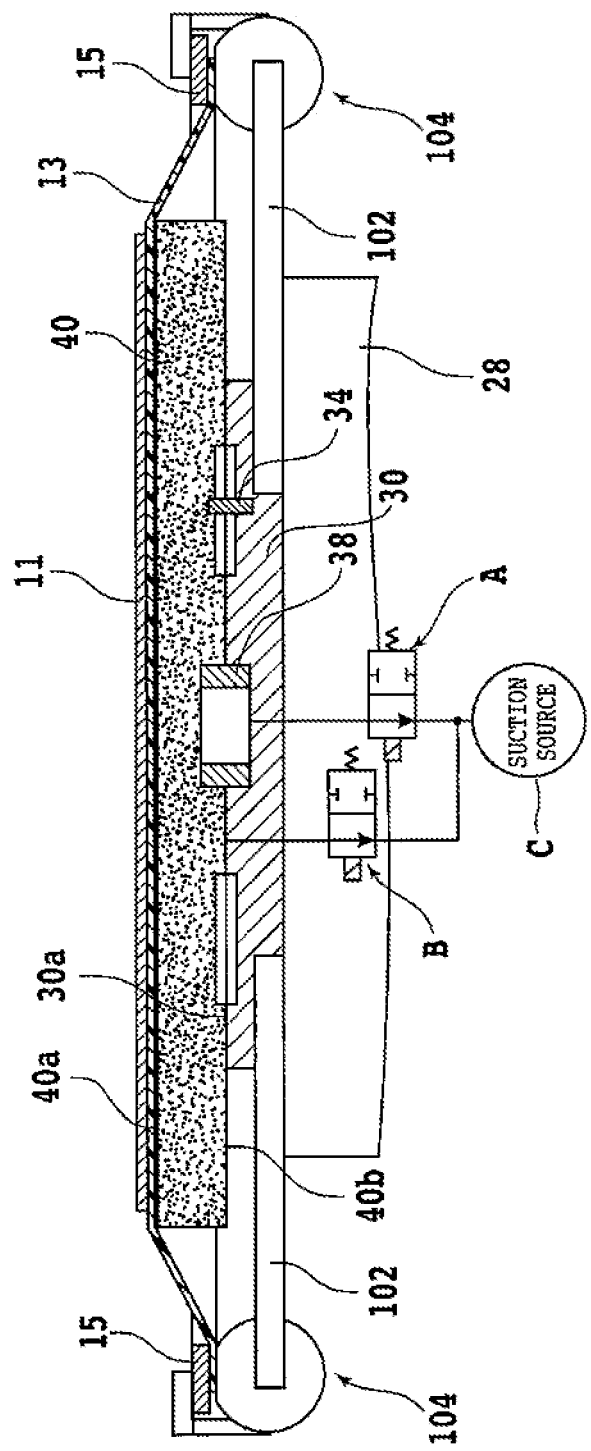
FIG. 11 is a side elevational view, partly in cross section, of a porous plate etc. according to a fourth embodiment of the present invention.

In order to secure the frame 15 of the workpiece unit in position, a plurality of clamp mechanisms are disposed sideways of the porous plate 40. FIG. 11 illustrates in side elevation, partly in cross section, the porous plate 40 etc. according to a fourth embodiment. Pairs of rod-shaped arms 102 made of metal are fixed to the upper surface of the support post 28 that is positioned beneath the support base 30. The pairs of arms 102 are positioned in respective positions at 12, 3, 6, and 9 o'clocks as the porous plate 40 is viewed in plan. FIG. 11 illustrates the arms 102 in the positions at 3 and 9 o'clocks. The clamp mechanisms, denoted by 104, are disposed on distal ends of the pairs of arms 102. The clamp mechanisms 104 grip part of the frame 15 of the workpiece unit, thereby fixing the frame 15 in position.

The structures, methods, etc. according to the above embodiments may be changed or modified without departing from the scope of the present invention. For example, the mold 62 used in the molding step S10 and the receptacle 64 used in the sintering step S20 may be the same object, i.e., the same receptacle. Furthermore, the first through fourth modifications may be applied to the second through fourth embodiments.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A chuck table for a processing apparatus, the processing apparatus including the chuck table for holding a plate-shaped workpiece under suction on a holding surface thereof, a processing unit for processing the workpiece held on the holding surface of the chuck table, and a moving unit for moving a support base supporting the chuck table thereon in a processing-feed direction, wherein
    the chuck table is formed only from a porous material having pores, wherein the chuck table includes an exposed outer circumferential side surface,
    the chuck table has the holding surface and a mountable assembly positioned opposite the holding surface and mountable on an upper surface of the support base, wherein the mountable assembly includes a central recess configured to engage a seal ring on the support base, said central recess extending partially into but not through the chuck table, and
    fluid passages defined in the chuck table for allowing a negative pressure transmitted from the support base to act on the holding surface are provided only by the pores in the porous material.

2. The chuck table according to claim 1, wherein, when a suction source held in fluid communication with the chuck table is in operation, a magnitude of a gage pressure developed on the mountable assembly when the workpiece is not held on the holding surface ranges from 60% to 80% of a magnitude of a gage pressure developed on the mountable assembly when the workpiece is held on the holding surface.

3. The chuck table according to claim 1, wherein the chuck table has
    a first region positioned on a holding surface side thereof, and
    a second region positioned on a mountable assembly side thereof and having pores larger than pores in the first region.

4. The chuck table according to claim 1, wherein the porous material includes porous ceramic or porous glass.

5. The chuck table according to claim 1, wherein the porous material includes porous glass, and the processing unit includes a laser beam applying unit.

6. The processing apparatus according to claim 1, wherein the chuck table and the support base each include an annular recess and a plurality of pin dents formed in each of the annular recesses, and a plurality of positioning pins extending into the pin dents of the chuck table and the support base.

7. A chuck table for a processing apparatus, the processing apparatus including the chuck table for holding a plate-shaped workpiece under suction on a holding surface thereof, a processing unit for processing the workpiece held on the holding surface of the chuck table, and a moving unit for moving a support base supporting the chuck table thereon in a processing-feed direction, wherein
 the chuck table consisting of only a porous material having pores, wherein the chuck table has a bottom surface opposite to the holding surface,
 the chuck table has the holding surface and a mountable assembly positioned opposite the holding surface and mountable on an upper surface of the support base, wherein the mountable assembly includes a central recess configured to receive a seal ring on the mountable assembly, said central recess extending partially into but not through the chuck table, and
 fluid passages defined in the chuck table for allowing a negative pressure transmitted from the support base to act on the holding surface are provided only by the pores in the porous material.

\* \* \* \* \*